United States Patent
Kim et al.

(10) Patent No.: US 9,118,329 B2
(45) Date of Patent: Aug. 25, 2015

(54) TOUCH SCREEN PANEL FABRICATION METHOD THEREOF

(71) Applicant: SAMSUNG DISPLAY CO., LTD., Yongin-si, Gyeonggi-do (KR)

(72) Inventors: Chang-Bum Kim, Yongin-si (KR); Jung-Mok Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 58 days.

(21) Appl. No.: 13/670,425

(22) Filed: Nov. 6, 2012

(65) Prior Publication Data

US 2014/0027262 A1    Jan. 30, 2014

(30) Foreign Application Priority Data

Jul. 24, 2012 (KR) .......................... 10-2012-0080614

(51) Int. Cl.
    *H03K 17/975*      (2006.01)
    *H03K 17/96*      (2006.01)
    (Continued)

(52) U.S. Cl.
    CPC ............ *H03K 17/9618* (2013.01); *G06F 3/044* (2013.01); *H03K 17/975* (2013.01); *H05K 3/00* (2013.01); *G06F 2203/04103* (2013.01);
    (Continued)

(58) Field of Classification Search
    CPC ....... H03K 17/975; H01H 43/08; H01H 9/26; H01H 13/72; H01H 13/76; H01H 13/70; H01H 25/00; H01H 25/04; H01H 1/20; H01H 9/00

USPC ........... 200/600, 5 B, 46, 5 R, 5 A, 292, 243, 200/511, 512, 268, 269, 275, 262; 345/173
See application file for complete search history.

(56) References Cited

U.S. PATENT DOCUMENTS

| | | | | |
|---|---|---|---|---|
| 8,279,201 | B2* | 10/2012 | Kang et al. | .................... 345/176 |
| 8,450,628 | B2* | 5/2013 | Yau et al. | ..................... 200/600 |
| 2008/0264699 | A1 | 10/2008 | Chang et al. | |

(Continued)

FOREIGN PATENT DOCUMENTS

| | | |
|---|---|---|
| KR | 10-2010-0006987 | 1/2010 |
| KR | 10-0967663 | 7/2010 |

(Continued)

OTHER PUBLICATIONS

EPO Search Report dated Jun. 15, 2015, for corresponding European Patent application 12197629.4, (12 pages).

*Primary Examiner* — Edwin A. Leon
*Assistant Examiner* — Anthony R. Jimenez
(74) *Attorney, Agent, or Firm* — Christie, Parker & Hale, LLP

(57) ABSTRACT

Accordingly, an embodiment of the present invention provides a touch screen panel including: sensing patterns in a display region of a transparent base; and sensing lines in a non-display region positioned at an outer side of the display region and coupled to the sensing patterns. Here, the sensing patterns include: a plurality of first sensing cells in a plurality of first lines in a first direction; first connecting lines coupling the first sensing cells in corresponding first lines to each other; second sensing cells in a plurality of second lines in a second direction; and second connecting lines coupling the second sensing cells in corresponding second lines to each other, and the first sensing cells and the second sensing cells each have a stacked structure, and the first connecting lines are integral with an upper layer of the first sensing cells.

13 Claims, 4 Drawing Sheets

(51) Int. Cl.
*G06F 3/044* (2006.01)
*H05K 3/00* (2006.01)
(52) U.S. Cl.
CPC . *G06F2203/04111* (2013.01); *Y10T 29/49155* (2015.01)

(56) References Cited

U.S. PATENT DOCUMENTS

2010/0007621 A1  1/2010  Kang et al.
2010/0164889 A1* 7/2010  Hristov et al. ............... 345/173
2011/0069035 A1* 3/2011  Chen et al. ................... 345/174
2011/0139516 A1  6/2011  Nirmal et al.
2011/0227840 A1  9/2011  Sim et al.
2012/0050186 A1  3/2012  Yi et al.
2012/0139848 A1  6/2012  Lee et al.

FOREIGN PATENT DOCUMENTS

KR      10-1101053     12/2011
KR   10-2012-0019162    3/2012

* cited by examiner

FIG. 6A
FIG. 6B
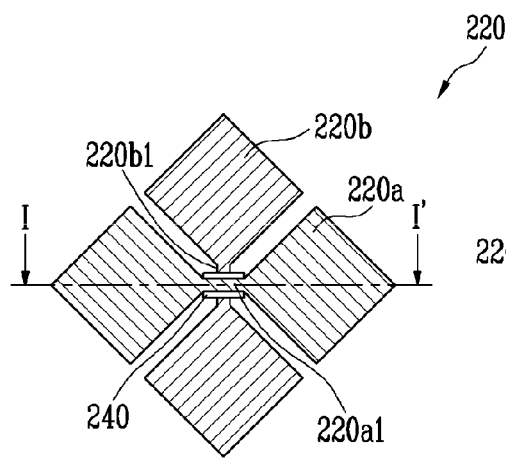
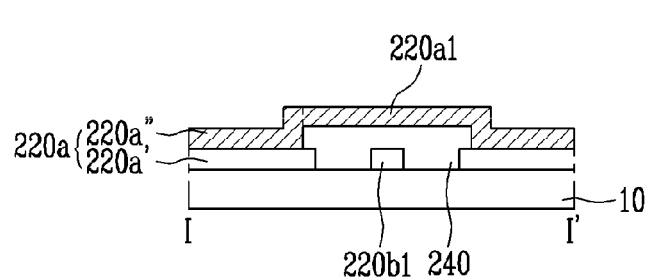

TOUCH SCREEN PANEL FABRICATION METHOD THEREOF

CROSS-REFERENCE TO RELATED APPLICATION

This application claims priority to and the benefit of Korean Patent Application No. 10-2012-0080614, filed on Jul. 24, 2012, in the Korean Intellectual Property Office, the entire content of which is incorporated herein by reference.

BACKGROUND

1. Field

Aspects of the present invention relate to a touch screen panel and a fabrication method thereof.

2. Description of the Related Art

A touch screen panel is an input device capable of inputting a user's instruction by selecting instruction contents displayed on a screen of an image display device, or the like, with a human's hand or an object.

To this end, the touch screen panel may be provided on a front surface of the image display device to convert a contact position directly contacted by the human hand or the object into an electric signal. Therefore, the instruction contents selected at the contact position may be recognized as an input signal.

Since the touch screen panel may be substituted for a separate input device connected to the image display device, such as a keyboard or a mouse, application fields thereof have been gradually extended.

Example types of the touch screen panel include a resistive type touch screen panel, a photosensitive type touch screen panel, a capacitive type touch screen panel, and the like. Among these, the capacitive type touch screen panel senses a change in capacitance formed between a conductive sensing pattern and neighboring other sensing patterns, a ground electrode, or the like, when a human hand or an object contacts the touch screen panel, thereby converting a contact position into an electric signal.

The capacitive type touch screen panel may include first sensing cells coupled to each other and formed in a first direction, and second sensing cells coupled to each other and formed in a second direction. Here, adjacent first sensing cells may be electrically connected to each other through a first connecting line, adjacent second sensing cells may be electrically connected to each other through a second connecting line, and the first and second connecting lines may overlap each other (but are insulated by an insulating layer interposed therebetween).

Particularly, a structure in which the first and second sensing cells are formed on the same layer and the first or second connecting lines are formed on the insulating layer in a bridge pattern to couple the first or second sensing cells to each other, respectively, has been used.

Here, the connecting lines formed on the insulating layer may be made of the same material as that of the sensing cell, for example, a transparent conductive material (such as, an indium tin oxide (ITO), or a low resistance metal material).

However, when the above-mentioned structure (that is, the sensing pattern structure in which the connecting lines are included in the bridge pattern) is used, the bridge pattern may be observed (or viewed), which may interfere with an image displayed on the image display device.

To reduce this interference, the quantity of material used in the bridge pattern and/or dimensions of length, width, and thickness thereof may be reduced (e.g., made maximally small). However, such a design increases resistance of the bridge pattern, which causes other problems, such as a deterioration of sensing sensitivity and vulnerability to external electrostatic discharge (ESD).

SUMMARY

An aspect of an embodiment according to the present invention is to provide a touch screen panel capable of preventing (or reducing) observation of patterns and reducing resistance of connecting lines by implementing first and second sensing cells, configuring sensing patterns in a stacked structure, and/or forming the connecting lines coupling first sensing cells to each other integrally with an upper layer of the first sensing cells, and a fabrication method thereof.

Accordingly, an embodiment of the present invention provides a touch screen panel including: sensing patterns in a display region of a transparent base; and sensing lines in a non-display region positioned at an outer side of the display region and coupled to the sensing patterns. Here, the sensing patterns include: a plurality of first sensing cells in a plurality of first lines in a first direction; first connecting lines coupling the first sensing cells in corresponding first lines from among the plurality of first lines to each other; second sensing cells in a plurality of second lines in a second direction; and second connecting lines coupling the second sensing cells in corresponding second lines from among the plurality of second lines to each other, and the first sensing cells and the second sensing cells each have a stacked structure, and the first connecting lines are integral with an upper layer of the first sensing cells.

Portions of the first connecting lines may overlap portions of the second connecting lines, and an insulating layer may be at a region between the first connecting lines and the second connecting lines.

Each first sensing cell may include: a lower first sensing cell at a lower portion thereof; and an upper first sensing cell at an upper portion thereof, and each second sensing cell may include: a lower second sensing cell at a lower portion thereof; and an upper second sensing cell at an upper portion thereof.

In an embodiment of the present invention, the first connecting lines are integral with the upper first sensing cells that are adjacent in the first direction, and the second connecting lines are integral with the upper second sensing cells that are adjacent in the second direction.

The first connecting lines and the upper first sensing cells may have thicknesses smaller than that of the lower first sensing cells.

The first sensing cells, the second sensing cells, the first connecting lines, and the second connecting lines may all be made of the same material. In an embodiment of the present invention, the same material is a crystalline indium tin oxide (ITO).

According to another aspect of the present invention, a method of fabricating a touch screen panel may be provided, the method including: forming a plurality of lower first sensing cells in a display region of a transparent base in a plurality of first lines in a first direction; forming a plurality of lower second sensing cells in the display region of the transparent base in a plurality of second lines in in a second direction; forming a plurality of second connecting lines coupling together the lower second sensing cells in corresponding second lines; forming an insulating layer on the second connecting lines; forming a transparent conductive material to cover a region of the transparent base on which the lower first sensing cells, the lower second sensing cells, the second connecting lines, and the insulating layer are formed; and patterning the transparent conductive material to form upper first sensing cells on the lower first sensing cells, to form first connecting lines coupling the upper first sensing cells in corresponding first lines to each other in the first direction, and to form upper second sensing cells on the lower second sensing cells.

The second connecting lines may be formed integrally with the lower second sensing cells that are adjacent in the second direction, and may be formed of the same material, on the same layer, and through the same process as that of the lower first sensing cells and the lower second sensing cells. In an embodiment of the present invention, the same material is a crystalline indium tin oxide (ITO).

The transparent conductive material may be made of the same material as that of the lower first sensing cells, the lower second sensing cells, and the second connecting lines.

The transparent conductive material may have a thickness smaller than thicknesses of the lower first sensing cells, the lower second sensing cells, and the second connecting lines.

The first connecting lines maybe formed integrally with the upper first sensing cells that are adjacent in the first direction, and may be formed of the same material, on the same layer, and through the same process as that of the upper first sensing cells and the upper second sensing cells.

BRIEF DESCRIPTION OF THE DRAWINGS

The accompanying drawings, together with the specification, illustrate exemplary embodiments of the present invention, and, together with the description, serve to explain aspects of the present invention.

FIGS. 4A to 6B are plan views and cross sectional views showing a fabrication process of a touch screen panel according to an exemplary embodiment of the present invention.

DETAILED DESCRIPTION

Figure 1:
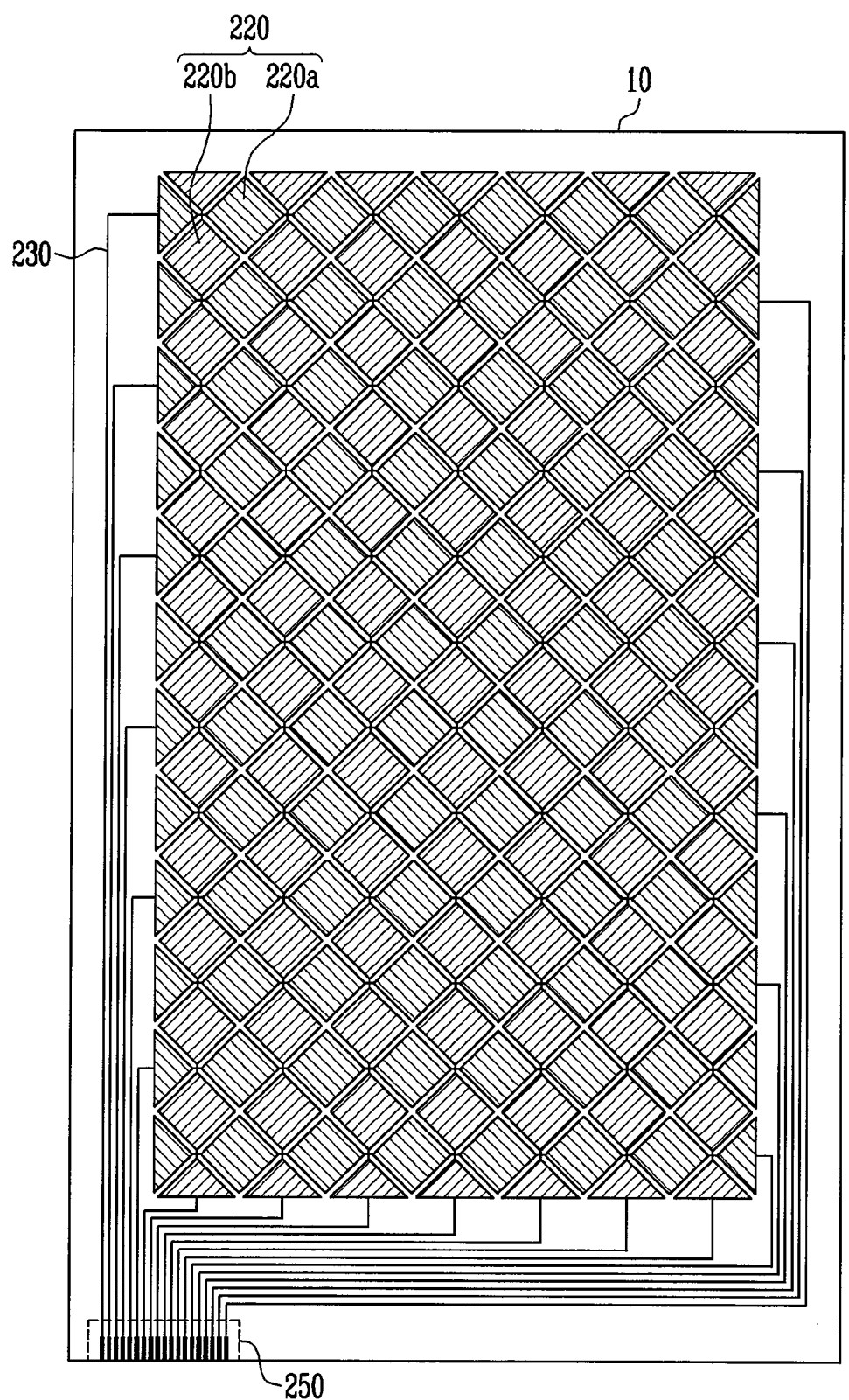
FIG. 1 is a plan view schematically showing a touch screen panel according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, when an element is referred to as being "on" another element, it may be directly on the another element or may be indirectly on the another element with one or more intervening elements interposed therebetween. Also, when an element is referred to as being "coupled to" (e.g., electrically coupled or connected to) another element, it may be directly coupled to the another element or may be indirectly coupled to the another element with one or more intervening elements interposed therebetween. Hereinafter, like reference numerals refer to like elements.

Exemplary embodiments of the present invention will now be described in detail with reference to the accompanying drawings.

FIG. 1 is a plan view schematically showing a touch screen panel according to an exemplary embodiment of the present invention.

Referring to FIG. 1, a touch screen panel according to an exemplary embodiment of the present invention may include a transparent base 10, sensing patterns 220 formed in a display region of the transparent base 10, and sensing lines 230 formed in a non-display region and positioned at an outer side of the display region to couple the sensing patterns 220 to an external driving circuit (not shown) via a pad part 250.

The transparent base 10 may be made of glass, but may also be implemented as a transparent base having a flexible characteristic and may be made of, for example, polyethyleneterephthalate (PET), retardant polycarbonate (PC), cyclic polyolefin (COP), polyimide (PI), polymethylmethacrylate (PMMA), triacetyl cellulose (TAC), ARTON, or the like.

The touch screen panel according to the exemplary embodiment of the present invention as described above is a capacitive type touch screen panel, which when a contact object such as a human hand, a stylus pen, or the like, contacts the touch screen panel, a change in capacitance according to a contact position is transferred from the sensing patterns 220 to the driving circuit (not shown) via the sensing lines 230 and the pad unit 250. In this case, the change in capacitance may be converted into an electrical signal by X and Y input processing circuits, or the like (not shown), such that the contact position is recognized.

In the exemplary embodiment of the present invention, the sensing patterns 220 may include first sensing cells 220a and second sensing cells 220b, which may be implemented in a stacked structure. Connecting lines coupling the first sensing cells 220a to each other may be formed integrally with an upper layer of the first sensing cells 220a, thereby making it possible to improve visualization of patterns (e.g., reduce observance of the sensing patters 220) and reduce resistance of the connecting lines.

An embodiment of the sensing patterns 220 according to the present invention will now be described below in detail with reference to FIGS. 2, 3A, and 3B.

Figure 2:
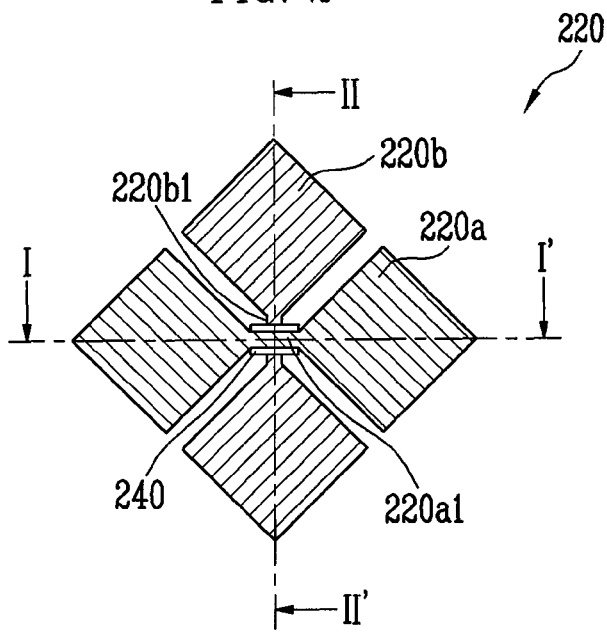
FIG. 2 is an enlarged view showing a part of the embodiment of a sensing pattern shown in FIG. 1.
Figure 3A:
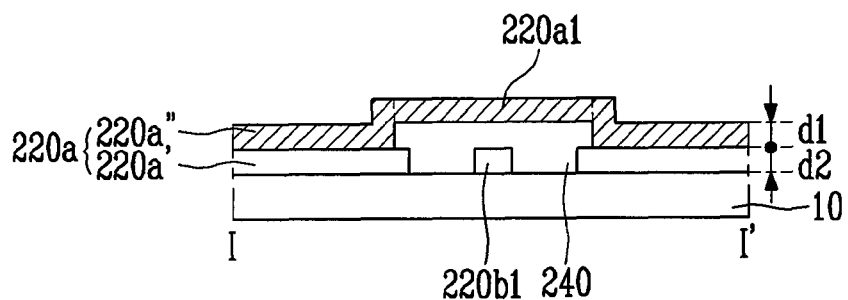
FIGS. 3A and 3B are cross sectional views showing cross sections I-I', II-II' of the sensing patterns shown in FIG. 2.
Figure 3B:
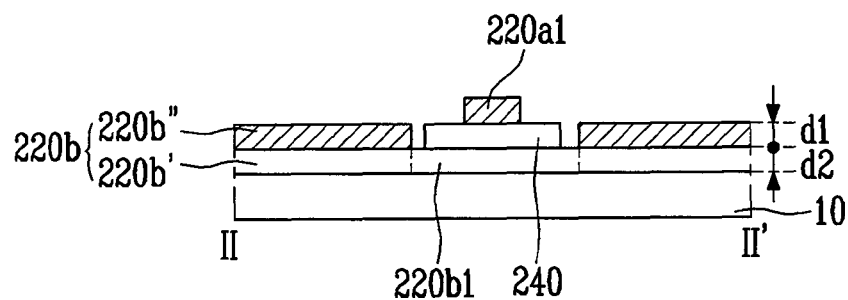

FIG. 2 is an enlarged view showing part of an example sensing pattern shown in FIG. 1, and FIGS. 3A and 3B are cross sectional views showing cross sections I-I', II-II' of the sensing patterns shown in FIG. 2.

The sensing patterns 220 include a plurality of first sensing cells 220a formed to be coupled to each other in each row line in a first direction (as an example, an X direction), first connecting lines 220a1 coupling the first sensing cells 220a to each other in the row direction, a plurality of second sensing cells 220b formed to be coupled to each other in each column line in a second direction (as an example, a Y direction), and second connecting lines 220b1 coupling the second cells 220b to each other in the column direction, as shown in FIG. 2.

Although FIG. 2 shows some of the sensing patterns shown in FIG. 1 for convenience, the touch screen panel has a structure in which the sensing pattern shown in FIG. 2 is repeatedly disposed.

The first and second sensing cells 220a and 220b are alternatively disposed so as not to be overlapped with each other; however, the first and second connecting lines 220a1 and 220b1 overlap with each other. Here, the first and second connecting lines 220a1 and 220b1 have an insulating layer 240 interposed therebetween in order to insulate and secure stability (e.g., to provide structural support).

That is, in a region between the first connecting line 220a1 and the second connecting line 220b1, which overlap with each other, an island-like insulating layer 240 is formed in order to prevent a short-circuit between the first and second connecting lines 220a1 and 220b1. The insulating layer 240 may be an inorganic insulating layer of a transparent material, for example, silicon dioxide ($SiO_2$) or silicon nitride ($Si_3N_x$).

According to the related art, a connecting line may be formed on the insulating layer 240 in a bridge pattern, which may be implemented in a rod shape, in order to couple adjacent sensing cells to each other. In this case, the bridge pattern having the rod shape may be disposed at a predetermined interval, which may cause a pattern to be viewed by a user, that is, a pattern visualization phenomenon.

In addition, in order to reduce the pattern visualization phenomenon, the amount of material used in the bridge pattern and dimensions of length, width, and thickness thereof may be reduced (e.g., be made maximally small). However, by reducing the pattern visualization phenomenon in this manner, a resistance of the bridge pattern increases, which may cause a deterioration of sensing sensitivity, or the like.

Therefore, in an exemplary embodiment of the present invention, each of the first and second sensing cells 220a and 220b configuring the sensing pattern 220 may be in a stacked structure (see, e.g., in FIGS. 3A and 3B, 220a' and 220a", and 220b' and 220b"), and a first connecting line 220a1 coupling first sensing cells 220a to each other may be formed integrally with second-first sensing cells 220a", which form upper layers of the first sensing cells 220a, thereby preventing (or reducing) visualization (or observation) of a pattern and reducing resistance of the connecting lines.

That is, the first sensing cell 220a may include a first-first sensing cell 220a' and a second-first sensing cell 220a", which overlaps the first-first sensing cell 220a'. Likewise, the second sensing cell 220b may include a first-second sensing cell 220b' and a second-second sensing cell 220b", which overlaps the first-second sensing cell 220b'.

In addition, in the exemplary embodiment of the present invention, the first connecting line 220a1 coupling the first sensing cells 220a to each other may be formed integrally with the second-first sensing cells 220a", which form the upper layers of the adjacent first sensing cells 220a, where the first connecting line 220a1 couples the first sensing cells 220a to each other in a first direction (as an example, a row direction). Also, the second connecting line 220b1 coupling the sensing cells 220b to each other may be formed integrally with the first-second sensing cells 220b', which form lower layers of the adjacent second sensing cells 220b, where the second connecting line 220b1 couples the second sensing cells 220b to each other in a second direction (as an example, a column direction).

Here, the island-like insulating layer 240 may be formed in a region in which the first connecting line 220a and the second connecting line 220b1 overlap each other.

In addition, the sensing cells 220a and 220b having the stacked structure may be made of a transparent conductive material, for example, an indium tin oxide (ITO) material.

Additionally, the first-first sensing cells 220a' and the second-first sensing cells 220a" of the first sensing cell 220a, the first connecting lines 220a1 integrally formed with the second-first sensing cell 220a", the first-second sensing cells 220b' and the second-second sensing cells 220b" of the second sensing cell 220b, and the second connecting lines 220b1 integrally formed with the first-second sensing cell 220b' may all be made of the same material. For example, the first sensing cells 220a, the second sensing cells 220b, and the connecting lines 220a1 and 220b1 may all made of a crystalline indium tin oxide (poly-ITO).

According to the related art, the connecting lines having a bridge pattern have been implemented in a rod shape as described above. When these connecting lines having a bridge pattern are made of the same material as that of the sensing cells, sensing cells positioned beneath the connecting line may also be etched in an etching process for patterning the bridge pattern.

For example, in the case in which the sensing cell is made of the crystalline poly ITO, when the connecting line made of the crystalline poly ITO is etched into the bridge pattern, the sensing cell made of the same material as that of the connecting line may also be etched. Therefore, according to the related art, to prevent the above-described etching of the sensing sell, the connecting line may be made of an amorphous indium tin oxide (a-ITO) that has been selectively etched into the bridge pattern separately, and then has been annealed.

However, in the exemplary embodiment of the invention, instead of implementing the bridge pattern according to the related art, the first connecting line 220a1 formed on the insulating layer 240 may be formed integrally with the second-first sensing cells 220a", which are formed to be overlapped (e.g., completely overlapped) with the lower sensing cells (i.e., the first-first sensing cells 220a'), such that a separate selective-etching need not be performed when the first sensing lines 220a1 and the second-first sensing cells 220a" are patterned.

Therefore, in the exemplary embodiment of the present invention, in the case in which the sensing cells 220a and 220b and the connecting lines 220a1 and 220b1 are all made of the crystalline poly ITO as described above, the above-described etching phenomena does not occur in the patterning process.

That is, according to the exemplary embodiment of the present invention, in the process of patterning the sensing cells 220a and 220b and the connecting lines 220a1 and 220b1, the same etchant may be used. As such, fewer kinds of etchants than those used in the structure according to the related art may be used, which may reduce confusion in the manufacturing line.

In addition, as shown in FIGS. 3A and 3B, the first connecting line 220a1 may be formed integrally with the second-first sensing cells 220a", thereby significantly reducing resistance of the connecting line as compared to that in the existing bridge pattern having the rod shape.

Therefore, even though the thicknesses of the first and second connecting line 220a1 and the second-first sensing cells 220a" may be reduced, the same (or substantially the same) line resistance as that of the structure according to the related art may be implemented.

In the exemplary embodiment of the present invention, an added thickness d1 of the first connecting line 220a1 and the second-first sensing cell 220a" may be smaller than the thickness d2 of the first-first sensing cell 220a'.

FIGS. 4A to 6B are plan views and cross sectional views showing a fabrication process of a touch screen panel according to the exemplary embodiment of the present invention.

Here, plan views and cross sectional views shown in FIGS. 4A to 6B will be described with reference to those shown in FIGS. 2 and 3A, by way of example.

Figure 4A:
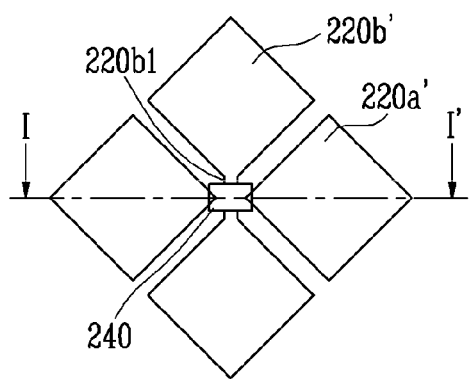
Figure 4B:
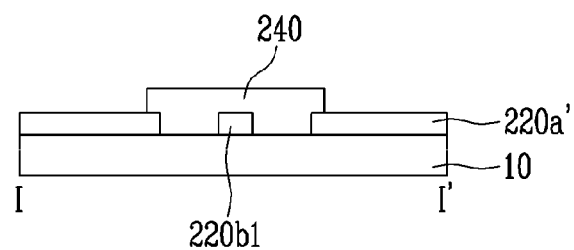

First, referring to FIGS. 4A-4B, there may be provided a plurality of first-first sensing cells 220a' arranged on a display region of a transparent base 10 for each line in a first direction (as an example, an X direction or row direction), a plurality of first-second sensing cells 220b' arranged for each line in a second direction (as an example, a Y direction or column direction), and second connecting lines 220b1 coupling the first-second sensing cells 220b' in the column direction.

Here, the first-first sensing cells 220a' and the first-second sensing cells 220b' may be alternately disposed so as not to be overlapped with each other, as shown in FIGS. 4A-4B, and the second connecting lines 220b1 may be formed integrally with the first-second sensing cells 220b' such that adjacent first-second sensing cells 220b' are coupled to each other through the second connecting line 220b1.

That is, the second connecting line 220b1 may be formed on the same layer, formed of the same transparent conductive material, and formed through the same process as the first-first sensing cells 220a' and the first-second sensing cells 220b'.

In addition, the first-first sensing cells 220a', the first-second sensing cells 220b', and the second connecting lines 220b1 may be made of the transparent conductive material, for example, a crystalline indium tin oxide (poly ITO).

Then, as shown in FIGS. 4A-4B, on a region which is overlapped with the second connecting line 220b1, an island-like insulating layer 240 may be formed. The insulating layer 240 may be an inorganic insulating layer of a transparent material, for example silicon dioxide ($SiO_2$) or silicon nitride ($Si_3N_x$).

Figure 5A:
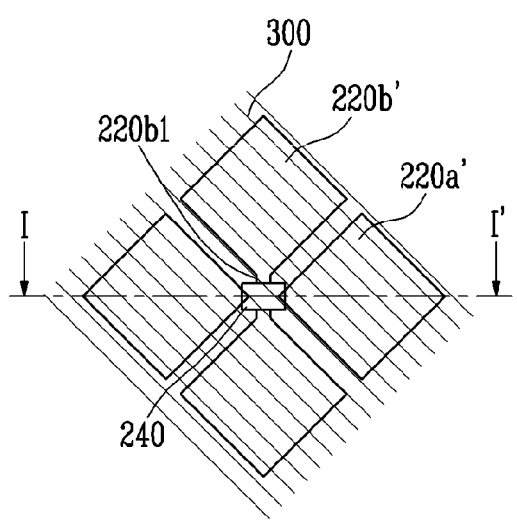
Figure 5B:
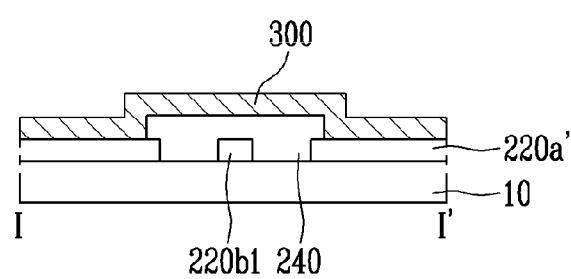

Next, referring to FIGS. 5A-5B, the transparent conductive material 300 may be formed on an entire surface of the transparent base 10 on which the first-first sensing cells 220a', the first-second sensing cells 220b', the second connecting lines 220b1 coupling the first-second sensing cells 220b', and the island-like insulating layer 240 are formed.

Here, the transparent conductive material may be made of the same material as that of the first-first sensing cells 220a', the first-second sensing cells 220b', and the second connecting lines 220b1, for example, crystalline indium tin oxide (poly ITO).

However, at the time of initial deposition of the entire surface, the transparent conductive material may be formed of the amorphous indium tin oxide (a-ITO), or the poly-ITO through the annealing process.

In addition, in the exemplary embodiment of the present invention, the transparent conductive material 300 may have a thickness smaller than the those of the first-first sensing cells 220a', the first-second sensing cells 220b', and the second connecting lines 220b1.

Next, as shown in FIGS. 6A-6B, the transparent conductive material 300 is patterned to form the second-first sensing cells 220a" at the region overlapping with the first-first sensing cells 220a', to form the first connecting lines 220a1 coupling the second-first sensing cells 220a", and to form the second-second sensing cells 220b" at the region overlapping with the first-second sensing cells 220b'.

Here, the second-first sensing cells 220a" and the second-second sensing cells 220b" are alternately disposed so as not to be overlapped with each other, as shown in FIG. 6A, and the first connecting lines 220a1 are formed integrally with the second-first sensing cells 220a", such that adjacent first-second sensing cells 220b' in the first direction are coupled to each other through the first connecting line 220a1, as shown in FIG. 6B.

That is, the first connecting line 220a1 may be formed on the same layer, formed of the same transparent conductive material, and formed through the same process as that of the second-first sensing cells 220a" and the second-second sensing cells 220b".

Additionally, while the first connecting line 220a1 and the second connecting line 220b1 overlap each other, they are isolated from each other by the island-like insulating layer 240.

In the exemplary embodiment of the invention, the first connecting line 220a1 formed on the insulating layer 240 may be formed integrally with the first-first sensing cells 220a', which are formed so as to be overlapped (e.g., completely overlapped) with the lower sensing cells (i.e., the first-first sensing cells 220a'), such that the first-first sensing cells 220a' positioned at an lower portion are overlapped (e.g., completely covered) when the first sensing lines 220a1 and the second-first sensing cells 220a" are patterned. Therefore, the separate selective-etching need not be performed.

Therefore, in the exemplary embodiment of the present invention, in the case in which the sensing cells 220a and 220b and the connecting lines 220a1 and 220b1 are all made of the crystalline poly ITO as described above, an etching problem is not generated in the patterning process.

That is, according to the exemplary embodiment of the present invention, in the process of patterning the sensing cells 220a and 220b and the connecting lines 220a1 and 220b1, the same etchant may be used, thereby fewer kinds of etchants than those used in the structure according to the related art may be used and confusion in the manufacturing line may be reduced.

In addition, in the exemplary embodiment of the present invention, each of first and second sensing cells 220a and 220b forming the sensing pattern 220 may be implemented in a stacked structure (in the figure, 220a' and 220a", and 220b' and 220b"), and a first connecting line 220a1 coupling first sensing cells to each other may be formed integrally with second-first sensing cells 220a", which form upper layers of the first sensing cells 220a, thereby preventing visualization of the pattern and reducing resistance of the first connecting line 220a1.

As set forth above, the first and second sensing cells that form the sensing patterns may have a stacked structure, and the connecting line coupling the first sensing cells to each other may be formed integrally with an upper layer of the first sensing cells, thereby improving visualization of patterns and reducing resistance of the connecting line.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A touch screen panel comprising:
   sensing patterns in a display region of a transparent base; and
   sensing lines in a non-display region positioned at an outer side of the display region and coupled to the sensing patterns,
   wherein the sensing patterns comprise:
      a plurality of first sensing cells in a plurality of first lines in a first direction;
      first connecting lines coupling the first sensing cells in corresponding first lines from among the plurality of first lines to each other;
      second sensing cells in a plurality of second lines in a second direction; and
      second connecting lines coupling the second sensing cells in corresponding second lines from among the plurality of second lines to each other,
   wherein the first sensing cells and the second sensing cells each have a stacked structure, each of the first sensing cells comprising an upper first sensing cell directly on a lower first sensing cell, wherein the first connecting lines are integral with the upper first sensing cells of the first sensing cells.

2. The touch screen panel according to claim 1,
wherein portions of the first connecting lines overlap portions of the second connecting lines, and
wherein an insulating layer is at a region between the first connecting lines and the second connecting lines.

3. The touch screen panel according to claim 1,
wherein each of the second sensing cells comprises a lower second sensing cell and an upper second sensing cell.

4. The touch screen panel according to claim 3,
wherein the first connecting lines are integral with the upper first sensing cells that are adjacent in the first direction, and
wherein the second connecting lines are integral with the upper second sensing cells that are adjacent in the second direction.

5. The touch screen panel according to claim 4,
wherein the first connecting lines and the upper first sensing cells have thicknesses smaller than that of the lower first sensing cells.

6. The touch screen panel according to claim 1,
wherein the first sensing cells, the second sensing cells, the first connecting lines, and the second connecting lines are all made of the same material.

7. The touch screen panel according to claim 6,
wherein the same material is a crystalline indium tin oxide (ITO).

8. A fabrication method of a touch screen panel comprising:
forming a plurality of lower first sensing cells in a display region of a transparent base in a plurality of first lines in a first direction;
forming a plurality of lower second sensing cells in the display region of the transparent base in a plurality of second lines in a second direction;
forming a plurality of second connecting lines coupling together the lower second sensing cells in corresponding second lines;
forming an insulating layer on portions of the display region that are overlapped by the second connecting lines;
forming a transparent conductive material to cover a region of the transparent base on which the lower first sensing cells, the lower second sensing cells, the second connecting lines, and the insulating layer are formed;
patterning the transparent conductive material to form upper first sensing cells on the lower first sensing cells, to form first connecting lines coupling the upper first sensing cells in corresponding first lines to each other in the first direction, and to form upper second sensing cells on the lower second sensing cells, and
wherein the transparent conductive material has a thickness smaller than a thickness of each of the lower first sensing cells, the lower second sensing cells, and the second connecting lines.

9. The fabrication method of a touch screen panel according to claim 8,
wherein the second connecting lines are formed integrally with the lower second sensing cells that are adjacent in the second direction, and are formed of the same material, on the same layer, and through the same process as that of the lower first sensing cells and the lower second sensing cells.

10. The fabrication method of a touch screen panel according to claim 9, wherein the same material is a crystalline indium tin oxide (ITO).

11. The fabrication method of a touch screen panel according to claim 8,
wherein the transparent conductive material is made of the same material as that of the lower first sensing cells, the lower second sensing cells, and the second connecting lines.

12. The fabrication method of a touch screen panel according to claim 8,
wherein the first connecting lines are formed integrally with the upper first sensing cells that are adjacent in the first direction, and are formed of the same material, on the same layer, and through the same process as that of the upper first sensing cells and the upper second sensing cells.

13. A touch screen panel comprising:
sensing patterns in a display region of a transparent base; and
sensing lines in a non-display region positioned at an outer side of the display region and coupled to the sensing patterns,
wherein the sensing patterns comprise:
a plurality of first sensing cells in a plurality of first lines in a first direction;
first connecting lines coupling the first sensing cells in corresponding first lines from among the plurality of first lines to each other;
second sensing cells in a plurality of second lines in a second direction; and
second connecting lines coupling the second sensing cells in corresponding second lines from among the plurality of second lines to each other;
wherein the first sensing cells and the second sensing cells each have a stacked structure;
wherein the first connecting lines are integral with an upper portion of the first sensing cells;
wherein each of the first sensing cells comprises a lower first sensing cell at a lower portion thereof and an upper first sensing cell at the upper portion thereof;
wherein each of the second sensing cells comprises a lower second sensing cell at a lower portion thereof and an upper second sensing cell at an upper portion thereof;
wherein the first connecting lines are integral with the upper first sensing cells that are adjacent in the first direction;
wherein the second connecting lines are integral with the upper second sensing cells that are adjacent in the second direction; and
wherein the first connecting lines and the upper first sensing cells have thicknesses smaller than that of the lower first sensing cells.

* * * * *